US012696823B2

(12) United States Patent
Togami et al.

(10) Patent No.: US 12,696,823 B2
(45) Date of Patent: Jul. 28, 2026

(54) SEMICONDUCTOR APPARATUS

(71) Applicant: Mitsubishi Electric Corporation, Tokyo (JP)

(72) Inventors: Mamoru Togami, Tokyo (JP); Kosuke Yamaguchi, Tokyo (JP); Shogo Shibata, Tokyo (JP); Kazufumi Oki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 318 days.

(21) Appl. No.: 18/469,516

(22) Filed: Sep. 18, 2023

(65) Prior Publication Data

US 2024/0266263 A1 Aug. 8, 2024

(30) Foreign Application Priority Data

Feb. 8, 2023 (JP) ................................. 2023-017757

(51) Int. Cl.
*H10W 90/00* (2026.01)
*H10W 70/40* (2026.01)

(52) U.S. Cl.
CPC ........ *H10W 90/811* (2026.01); *H10W 70/424* (2026.01); *H10W 90/756* (2026.01)

(58) Field of Classification Search
CPC ......... H01L 23/49575; H01L 23/49548; H01L 24/48; H01L 2224/48245; H10W 90/811; H10W 70/424; H10W 90/756; H10W 72/50
See application file for complete search history.

(56) References Cited

U.S. PATENT DOCUMENTS

| | | | |
|---|---|---|---|
| 5,049,977 A | 9/1991 | Sako | |
| 5,508,232 A * | 4/1996 | Ueda ................... | H10W 74/016 29/827 |
| 6,992,734 B1 * | 1/2006 | Morishita ......... | G02F 1/133308 349/58 |

(Continued)

FOREIGN PATENT DOCUMENTS

| | | | |
|---|---|---|---|
| CN | 103975427 A * | 8/2014 | .......... H10W 90/811 |
| CN | 105452886 B * | 2/2018 | ............ H10W 90/00 |

(Continued)

OTHER PUBLICATIONS

Office Action issued in DE 10 2023 130 708.8; mailed by the German Patent and Trade Mark Office on Jan. 8, 2026.

(Continued)

*Primary Examiner* — Laura M Menz
(74) *Attorney, Agent, or Firm* — Studebaker Brackett PLLC

(57) ABSTRACT

According to the present disclosure, a semiconductor apparatus comprises a plurality of integrated circuits, an IC frame on which the plurality of integrated circuits are mounted, and a sealing material. The IC frame comprises a first protrusion extending in a longitudinal direction of the IC frame, a second protrusion positioned on the opposite side to the first protrusion in the IC frame and extending in an opposite direction to the first protrusion, and a third protrusion extending in a direction perpendicular to the longitudinal direction of the IC frame and incorporated in the sealing material.

7 Claims, 3 Drawing Sheets

(56)  References Cited

U.S. PATENT DOCUMENTS

| | | | | |
|---|---|---|---|---|
| 7,432,997 | B2 * | 10/2008 | Morishita | G02F 1/133308 349/58 |
| 7,542,106 | B2 * | 6/2009 | Morishita | G02F 1/133308 349/58 |
| 7,834,950 | B2 * | 11/2010 | Morishita | G02F 1/133604 349/58 |
| 8,102,482 | B2 * | 1/2012 | Morishita | G02F 1/133608 349/58 |
| 12,021,010 | B2 * | 6/2024 | Shirai | H10W 70/433 |
| 2003/0141579 | A1 * | 7/2003 | Oda | H10W 90/811 257/690 |
| 2006/0038934 | A1 * | 2/2006 | Morishita | G02F 1/133308 349/58 |
| 2007/0258021 | A1 * | 11/2007 | Morishita | G02F 1/133604 349/58 |
| 2008/0180601 | A1 * | 7/2008 | Morishita | G02F 1/133308 349/70 |
| 2008/0186426 | A1 * | 8/2008 | Morishita | G02F 1/133608 349/58 |
| 2008/0239196 | A1 * | 10/2008 | Morishita | G02F 1/133604 349/58 |
| 2011/0037921 | A1 * | 2/2011 | Morishita | G02F 1/133608 349/58 |
| 2015/0084173 | A1 | 3/2015 | Zhang et al. | |
| 2018/0122727 | A1 | 5/2018 | Sato et al. | |
| 2018/0334567 | A1 * | 11/2018 | Kawamura | C08G 59/1433 |
| 2020/0194353 | A1 * | 6/2020 | Yokoyama | H10W 70/481 |
| 2020/0211940 | A1 * | 7/2020 | Tuncer | H10W 74/111 |
| 2020/0312754 | A1 * | 10/2020 | Yasuda | H10W 70/424 |
| 2020/0403612 | A1 * | 12/2020 | Kawahara | H03K 17/602 |
| 2022/0020669 | A1 * | 1/2022 | Mcknight-Macneil | H10W 70/411 |
| 2022/0148937 | A1 * | 5/2022 | Togami | H10W 46/00 |
| 2022/0310580 | A1 * | 9/2022 | Chiu | H10W 20/023 |
| 2023/0317572 | A1 * | 10/2023 | Oki | H10W 70/429 257/674 |
| 2023/0378010 | A1 * | 11/2023 | Balaraman | H10W 74/111 |
| 2024/0030106 | A1 * | 1/2024 | Futamura | H10W 70/417 |
| 2024/0063096 | A1 * | 2/2024 | Tanaka | H10W 70/411 |
| 2024/0136399 | A1 * | 4/2024 | Sugimachi | H10D 62/127 |
| 2024/0266263 | A1 * | 8/2024 | Togami | H10W 70/421 |
| 2025/0112095 | A1 * | 4/2025 | Oki | H10P 74/203 |
| 2025/0201682 | A1 * | 6/2025 | Otremba | H10W 74/111 |

FOREIGN PATENT DOCUMENTS

| | | | | | |
|---|---|---|---|---|---|
| CN | 111213214 | A | * | 5/2020 | H10D 84/40 |
| CN | 114301308 | A | * | 4/2022 | H10W 42/60 |
| CN | 118738039 | A | * | 10/2024 | H10W 72/015 |
| CN | 119730318 | A | * | 3/2025 | H10D 30/65 |
| DE | 69025815 | T2 | | 8/1996 | |
| JP | H05-87965 | U | | 11/1993 | |
| JP | 2000175966 | A | * | 6/2000 | |
| JP | 2001100183 | A | * | 4/2001 | G02F 1/133308 |
| JP | 3181935 | B2 | * | 7/2001 | |
| JP | 2001242477 | A | * | 9/2001 | G02F 1/1362 |
| JP | 2004-119819 | A | | 4/2004 | |
| JP | 3724966 | B2 | * | 12/2005 | |
| JP | 3919982 | B2 | * | 5/2007 | G02F 1/133608 |
| JP | 2012505517 | A | * | 3/2012 | H05B 47/155 |
| JP | 5492899 | B2 | * | 5/2014 | H05B 47/155 |
| JP | 2015-065339 | A | | 4/2015 | |
| JP | 2019121698 | A | * | 7/2019 | H10W 90/811 |
| JP | 2020-205702 | A | | 12/2020 | |
| JP | 2022-020969 | A | | 2/2022 | |
| JP | 7294102 | B2 | * | 6/2023 | |
| WO | WO-2011004746 | A1 | * | 1/2011 | H10W 74/111 |
| WO | WO-2013171996 | A1 | * | 11/2013 | H10W 90/811 |
| WO | 2018-096573 | A1 | | 5/2018 | |
| WO | WO-2024247464 | A1 | * | 12/2024 | H04N 23/54 |

OTHER PUBLICATIONS

"Notice of Reasons for Refusal" Office Action issued in JP 2023-017757; mailed by the Japanese Patent Office on May 26, 2026.

* cited by examiner

400a

500

SEMICONDUCTOR APPARATUS

BACKGROUND OF THE INVENTION

Field

The present disclosure relates to a semiconductor apparatus.

Background

WO 2018/096573 A discloses a technique relating to a lead frame on which respective chips of two integrated circuits (ICs) are mounted. The lead frame includes one protruding section that supports an IC die bonding section in a process for IC die bonding or wire bonding.

With the IC die bonding section being widened in order to mount two chips, in the lead frame described above, the area and the weight of the IC die bonding section is increased. As a result, the lead frame is prone to vibration or misalignment at the time of IC die bonding or wire bonding.

However, since the lead frame includes only one protruding section that supports the IC die bonding section, vibration and misalignment cannot be sufficiently prevented. As a result, the problem is that accuracies of IC die bonding and wire bonding are deteriorated, leading to deterioration in manufacturing efficiency and manufacturing quality.

SUMMARY

In view of the above-described problems, an object of the present disclosure is to provide a semiconductor apparatus for which the manufacturing efficiency and the manufacturing quality can be improved by preventing vibration and misalignment of a lead frame.

The features and advantages of the present disclosure may be summarized as follows.

A semiconductor apparatus according to the present disclosure includes: a plurality of integrated circuits, an IC frame on which the plurality of integrated circuits are mounted, and a sealing material, wherein the IC frame comprises a first protrusion extending in a longitudinal direction of the IC frame, a second protrusion positioned on the opposite side to the first protrusion in the IC frame and extending in an opposite direction to the first protrusion, and a third protrusion extending in a direction perpendicular to the longitudinal direction of the IC frame and incorporated in the sealing material.

Other and further objects, features and advantages of the disclosure will appear more fully from the following description.

DESCRIPTION OF EMBODIMENTS

First Embodiment

Figure 1:
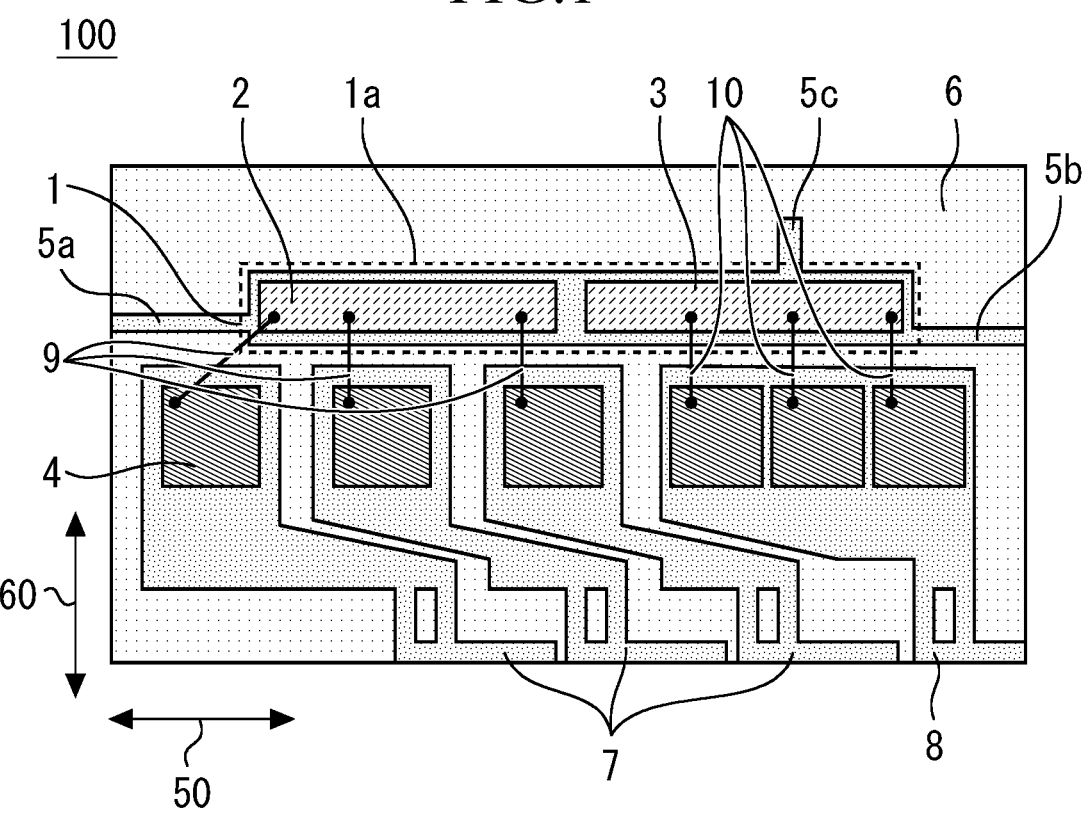
FIG. 1 is a plan view illustrating a semiconductor apparatus according to a first embodiment of the present disclosure.

FIG. 1 is a plan view illustrating a semiconductor apparatus according to a first embodiment of the present disclosure. The semiconductor apparatus 100 includes an IC frame 1. The IC frame 1 is a conductive lead frame having a longitudinal direction in a first direction 50.

The IC frame 1 has an IC die bonding section 1a indicated by a dotted line. An LVIC 2 and an HVIC 3 are arranged in parallel in the first direction 50 and joined to each other on the IC die bonding section 1a. The LVIC 20 is a control IC. The HVIC 3 is a control IC to which a voltage having a higher potential than that of the LVIC 2 is inputted.

The LVIC 2 is electrically joined via an LVIC wiring 9 to a semiconductor device 4 joined to a low side frame 7. The HVIC 3 is electrically joined via an HVIC wiring 10 to the semiconductor device 4 joined to a high side frame 8. The IC die bonding section 1a, the LVIC 2, the HVIC 3, and the semiconductor device 4 are covered with a sealing material having an insulating property.

The IC die bonding section 1a has a first protrusion 5a and a second protrusion 5b each extending in the first direction 50 and a third protrusion 5c extending in a second direction 60. The second direction 60 is a direction perpendicular to the first direction 50. The entire third protrusion 5c is incorporated in a sealing material 6. The third protrusion 5c is provided at a side edge on the opposite side to the semiconductor device 4. The third protrusion 5c may be positioned in the vicinity of the LVIC 2, although positioned in the vicinity of the HVIC 3.

A wire bonding process for the semiconductor apparatus 100 will be described. In the wire bonding process, the LVIC 2 and the semiconductor device 4 are bonded to each other via the LVIC wiring 9. The HVIC 3 and the semiconductor device 4 are bonded to each other via the HVIC wiring 10. In this case, the first protrusion 5a, the second protrusion 5b, and the third protrusion 5c are pressed by a jig provided in a bonding apparatus, to fix the semiconductor apparatus 100.

The IC die bonding section 1a is configured such that the area thereof increases to mount two types of control ICs, i.e., the LVIC 2 and the HVIC 3 thereon. Accordingly, the IC frame 1 is prone to vibration and misalignment at the time of wire bonding. However, the IC frame 1 can be fixed in only the first direction 50 when fixed at one point, i.e., the first protrusion 5a or two points, i.e., the first protrusion 5a and the second protrusion 5b, which is not enough to prevent vibration.

The IC frame 1 is fixed at three points further including the third protrusion 5c extending in the second direction 60. As a result, the vicinity of the center in the longitudinal direction of the IC frame 1 that has been loosely fixed can be pressed. Accordingly, vibration and misalignment of the IC frame 1 can be sufficiently prevented. This can result in stable wire bonding, thereby it is possible to improve the manufacturing efficiency and the manufacturing quality of the semiconductor apparatus 100.

The IC frame 1 is fixed at the three points including the third protrusion 5c, whereby an ultrasonic wave can be easily transmitted at the time of wire bonding. Accordingly, a wire bondability can be improved. Further, the third protrusion 5c is not exposed from the sealing material 6. Accordingly, an insulating property from outside the semiconductor apparatus 100 is easy to ensure. These are effective to improve the wire bondability with the two ICs, i.e., the LVIC 2 and the HVIC 3 mounted on the elongated IC frame 1.

Second Embodiment

Figure 2:
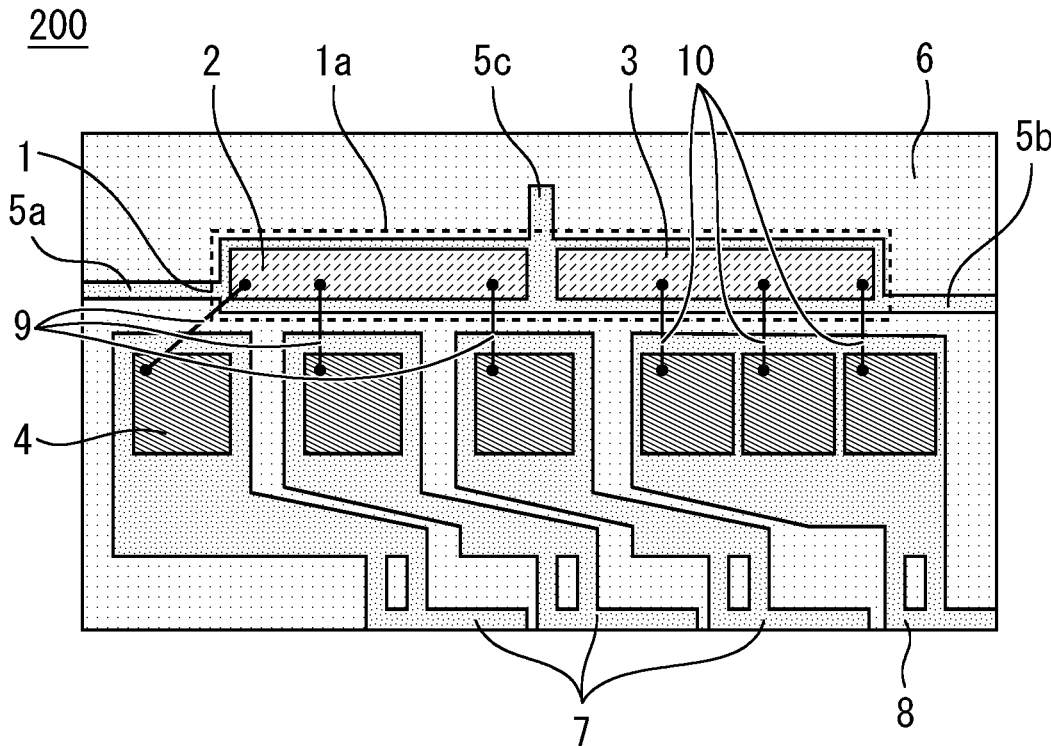
FIG. 2 is a plan view illustrating a semiconductor apparatus according to a second embodiment of the present disclosure.

FIG. 2 is a plan view illustrating a semiconductor apparatus according to a second embodiment of the present disclosure. The semiconductor apparatus 200 according to the second embodiment differs from that in the first embodiment in that a third protrusion 5c is at a position that is equidistant from an LVIC 2 and an HVIC 3.

An IC die bonding section 1a has a third protrusion 5c. The third protrusion 5c is positioned to be equidistant from the LVIC 2 and the HVIC 3 in a first direction 50. As a result, an IC frame 1 can be more stably fixed than when the third protrusion 5c is positioned to be a short distance away from the LVIC 2 or the HVIC 3. That is, vibration and misalignment of the IC frame 1 can be prevented to a minimum. This can result in stable wire bonding, thereby it is possible to improve the manufacturing efficiency and the manufacturing quality of the semiconductor apparatus 200.

Third Embodiment

Figure 3:
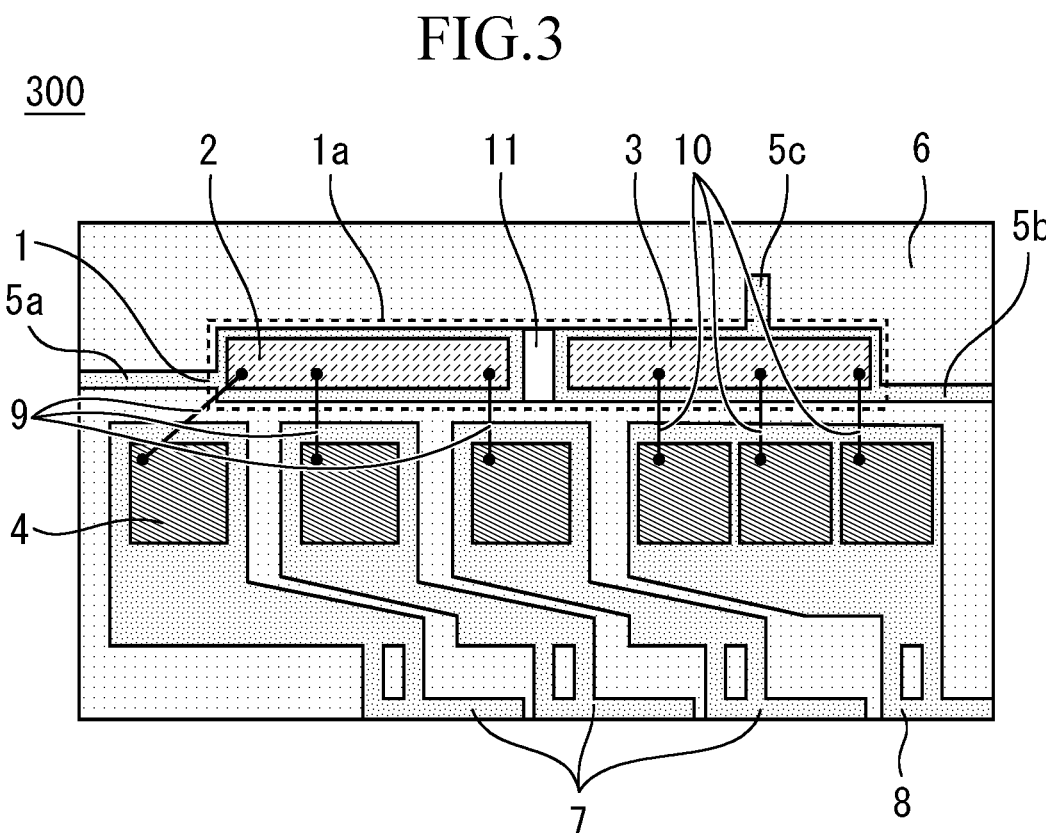
FIG. 3 is a plan view illustrating a semiconductor apparatus according to a third embodiment of the present disclosure.

FIG. 3 is a plan view illustrating a semiconductor apparatus according to a third embodiment of the present disclosure. A semiconductor apparatus 300 according to the third embodiment differs from that in the first embodiment in that an IC die bonding section 1a has a plated region between an LVIC 2 and an HVIC 3.

The IC die bonding section 1a has a plating section 11. The plating section 11 is positioned between the LVIC 2 and the HVIC 3. As a result, a wiring from the LVIC 2 and the HVIC 3 can be shortened because it can be wire-bonded to the plating section 11. That is, wiring displacement can be prevented in a manufacturing process when a sealing material is injected, thereby it is possible to improve the manufacturing quality of the semiconductor apparatus 300.

When the area of the plating section 11 is sized to enable a plurality of wirings, the plurality of wirings from the LVIC 2 and the HVIC 3 can be wire-bonded. This makes it possible to improve the functionality of the semiconductor apparatus 300.

Fourth Embodiment

Figure 4:
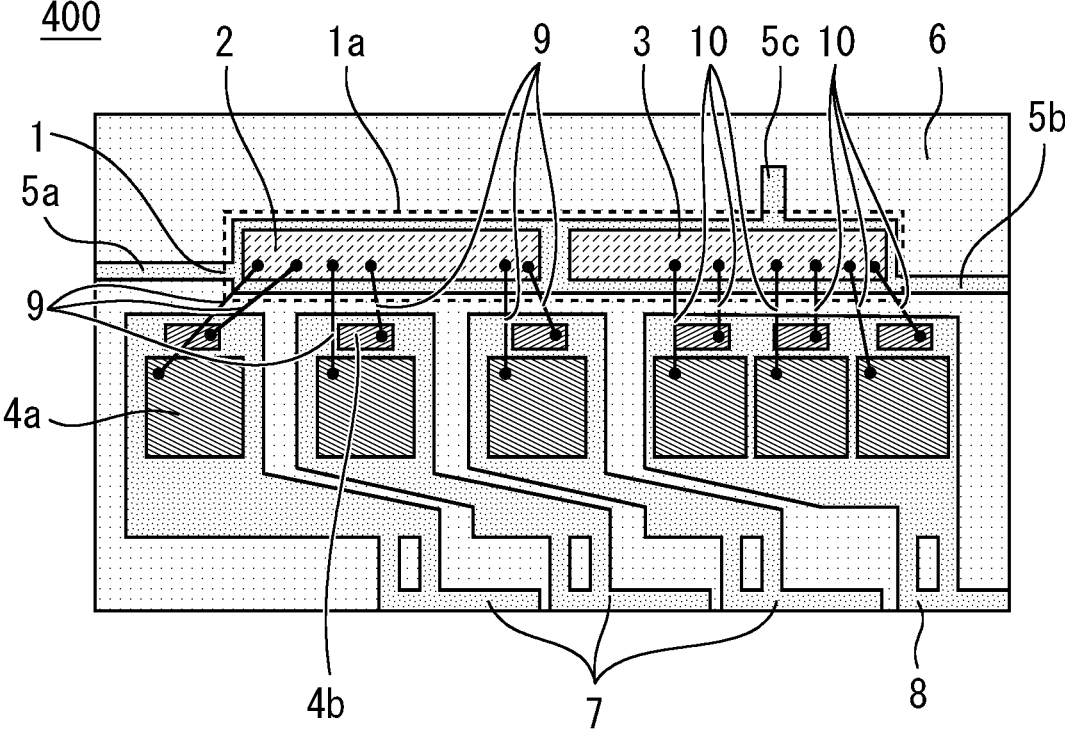
FIG. 4 is a plan view illustrating a semiconductor apparatus according to a fourth embodiment of the present disclosure.

FIG. 4 is a plan view illustrating a semiconductor apparatus according to a fourth embodiment of the present disclosure. A semiconductor apparatus 400 according to the fourth embodiment differs from that in the first embodiment in that it includes two types of semiconductor devices.

A low side frame 7 has semiconductor devices 4a and 4b. A high side frame 8 has the semiconductor devices 4a and 4b. As a result, the respective numbers of LVIC wirings 9 and HVIC wirings 10 increase.

However, in the semiconductor apparatus 400, an IC die bonding section 1a has a first protrusion 5a, a second protrusion 5b, and a third protrusion 5c. Each of the LVIC 2 and the HVIC 3 can have a shape that is elongated in a first direction 50. That is, even if the respective numbers of LVIC wirings 9 and HVIC wirings 10 increase, an arrangement of the wirings is optimized so that the wirings themselves can be shortened.

This makes it possible to improve the manufacturing quality of the semiconductor apparatus 400. Further, two types of semiconductor devices are mounted, thereby it is possible to improve the functionality of the semiconductor apparatus 400.

Figure 5:
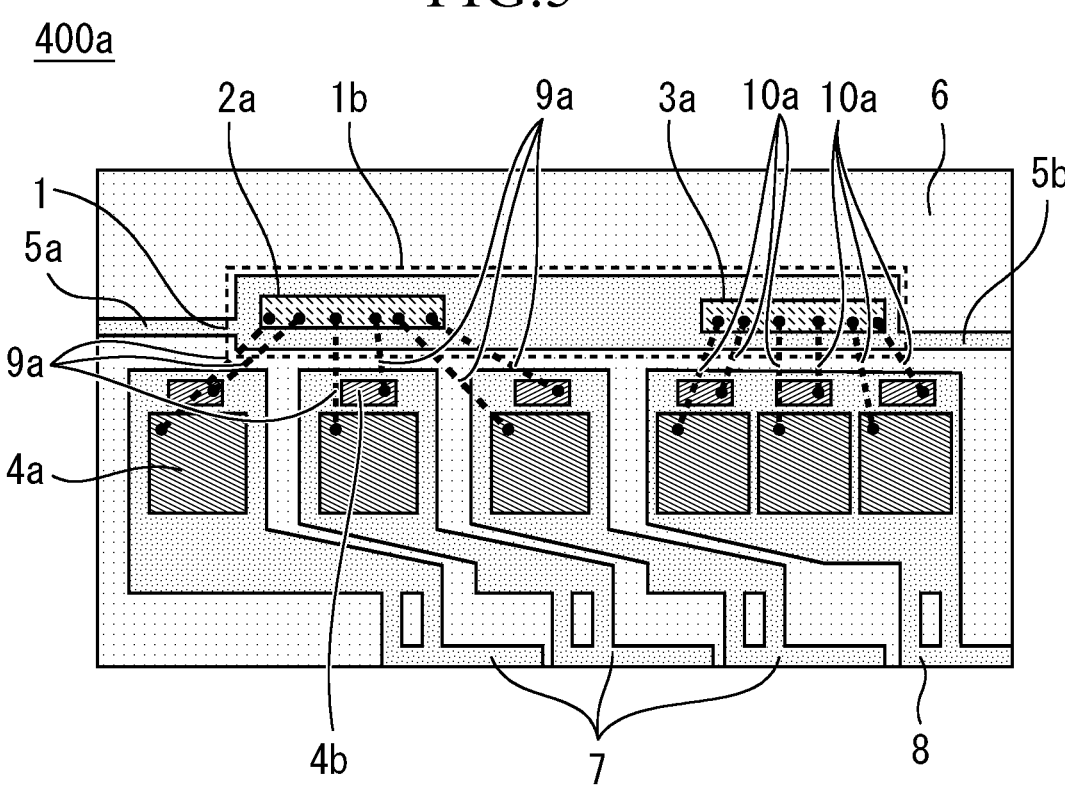
FIG. 5 is a plan view illustrating a comparison example with the semiconductor apparatus according to the fourth embodiment of the present disclosure.

FIG. 5 is a plan view illustrating a comparison example with the semiconductor apparatus according to the fourth embodiment of the present disclosure. In a semiconductor apparatus 400a, an IC die bonding section 1b has a first protrusion 5a and a second protrusion 5b but does not have a third protrusion 5c. Accordingly, each of an LVIC 2a and an HVIC 3a cannot have a shape that is elongated in a first direction 50. That is, even if the respective numbers of LVIC wirings 9a and HVIC wirings 10a increase, an arrangement of the wirings cannot be optimized so that the wirings themselves cannot be shortened.

Comparison of the semiconductor apparatus 400 with the semiconductor apparatus 400a shows that the arrangement of the LVIC wirings 9 and the HVIC wirings 10 is optimized so that the wirings themselves can be shortened, that is, shows that the IC die bonding section 1a has the three protrusions including the third protrusion 5c, thereby it is possible to improve the manufacturing quality of the semiconductor apparatus 400.

Fifth Embodiment

Figure 6:
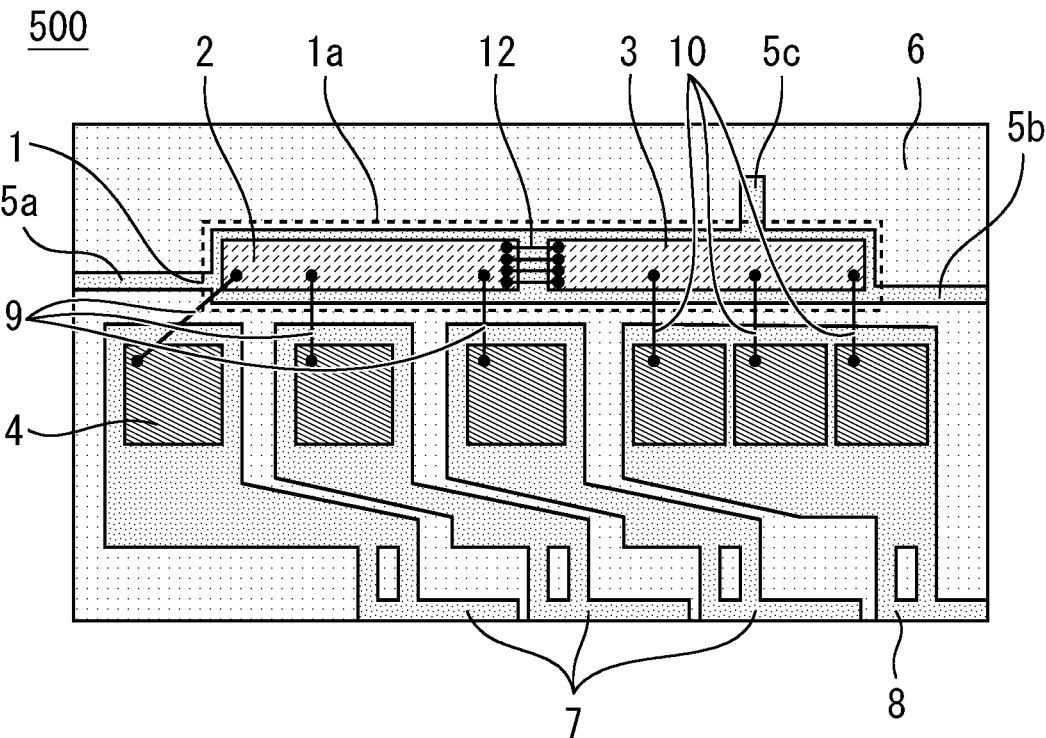
FIG. 6 is a plan view illustrating a semiconductor apparatus according to a fifth embodiment of the present disclosure.

FIG. 6 is a plan view illustrating a semiconductor apparatus according to a fifth embodiment of the present disclosure. A semiconductor apparatus 500 according to the fifth embodiment differs from that in the first embodiment in that it has a wiring between an LVIC 2 and an HVIC 3.

An IC die bonding section 1a has a wiring 12. The wiring 12 connects the LVIC 2 and the HVIC 3 to each other. Although the IC die bonding section 1a has four wirings 12, the number of wirings is not limited to this, but may be one or more.

The wiring 12 can directly connect a wiring from a lead frame on the control side from the LVIC 2 to the HVIC 3. As a result, the entire wiring can be shortened. That is, wiring displacement can be prevented in a manufacturing process when a sealing material is injected, thereby it is possible to improve the manufacturing quality of the semiconductor apparatus 500.

Further, respective functions of the LVIC 2 and the HVIC 3 can be combined with each other by the wiring 12. This makes it possible to improve the functionality of the semiconductor apparatus 500.

Sixth Embodiment

A semiconductor apparatus according to a sixth embodiment is similar to the semiconductor apparatus 100 in its configuration itself. However, the sixth embodiment differs from the first embodiment in that a semiconductor device to be connected to an LVIC 2 and an HVIC 3 is a wide bandgap semiconductor.

Each of a low side frame 7 and a high side frame 8 has a semiconductor device 4. The semiconductor device 4 is a wide bandgap semiconductor made of silicon carbide, a gallium nitride-based material, diamond, or the like. This can result in an improvement in electrical characteristic such as an improvement in power loss of the semiconductor apparatus. The wide bandgap semiconductor can be more easily miniaturized than a semiconductor device made of Si or the like. Accordingly, the entire semiconductor apparatus can also be miniaturized.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2023-017757, filed on Feb. 8, 2023 including specification, claims, drawings and summary, on which the Convention priority of the present application is based, are incorporated herein by reference in its entirety.

The invention claimed is:

1. A semiconductor apparatus comprising:
a plurality of integrated circuits comprising a low voltage integrated circuit (LVIC) and a high voltage integrated circuit (HVIC), an IC frame on which the plurality of integrated circuits are mounted,
a low side frame and a low voltage wiring electrically connecting the L VIC to the low side frame,
a high side frame and a high voltage wiring electrically connecting the HVIC to the high side frame, wherein:
the IC frame comprises:
a first protrusion extending in a longitudinal direction of the IC frame,
a second protrusion positioned on an opposite side to the first protrusion in the IC frame and extending in an opposite direction to the first protrusion, and
a third protrusion extending in a direction perpendicular to the longitudinal direction of the IC frame and incorporated in a sealing material, and extending away from a first edge of the IC frame that is opposite to a second edge of the IC frame that is proximate to the low side frame and the high side frame.

2. The semiconductor apparatus according to claim 1, wherein
the plurality of integrated circuits comprise two integrated circuits, and
the third protrusion exists at a position that is equidistant from the two integrated circuits.

3. The semiconductor apparatus according to claim 1, wherein
the plurality of integrated circuits comprise two integrated circuits, and
the IC frame has a plating section between the two integrated circuits.

4. The semiconductor apparatus according to claim 1, further comprising
a group of semiconductor devices positioned on the opposite side to the third protrusion in the IC frame and arranged in parallel in the longitudinal direction of the IC frame,
wherein the group of semiconductor devices include a plurality of types of semiconductor devices.

5. The semiconductor apparatus according to claim 1, wherein the plurality of integrated circuits are connected to one another by a wiring.

6. The semiconductor apparatus according to claim 4, wherein a semiconductor constituting the group of semiconductor devices is formed of a wide bandgap semiconductor.

7. The semiconductor apparatus according to claim 6, wherein the wide bandgap semiconductor is silicon carbide, a gallium nitride-based material, or diamond.

* * * * *